(12) United States Patent
Kim

(10) Patent No.: US 10,074,787 B2
(45) Date of Patent: Sep. 11, 2018

(54) LIGHT EMITTING DIODE

(71) Applicant: LUMENS CO., LTD., Yongin-si, Gyeonggi-do (KR)

(72) Inventor: Dae Won Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/488,513

(22) Filed: Apr. 16, 2017

(65) Prior Publication Data

US 2017/0331017 A1    Nov. 16, 2017

(30) Foreign Application Priority Data

May 13, 2016 (KR) .................. 10-2016-0058562

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 27/153* (2013.01);
(Continued)

(58) Field of Classification Search
CPC ....... H01L 33/38; H01L 33/387; H01L 33/62; H01L 27/153; H01L 27/156; H01L 23/498; H01L 23/538
See application file for complete search history.

(56) References Cited

U.S. PATENT DOCUMENTS 6,472,718 B2    10/2002   Lell
7,709,849 B1 *   5/2010   Kal .................. H01L 27/153
                                              257/96
(Continued)

FOREIGN PATENT DOCUMENTS

JP    2009253035 A    10/2009
JP    2010147462 A     7/2010
(Continued)

OTHER PUBLICATIONS

Notice of Preliminary Rejection dated Oct. 4, 2016 in Japanese Application No. 2016-150025, 2 pg(s).
(Continued)

*Primary Examiner* — Latanya N Crawford
(74) *Attorney, Agent, or Firm* — Mei & Mark LLP

(57) ABSTRACT

A light emitting diode is disclosed. The light emitting diode includes: a plurality of light emitting cells including a first light emitting cell and a second light emitting cell spaced apart from each other on a single substrate; a continuous passivation layer formed over the upper surface and one facet of the first light emitting cell, the upper surface and the other facet of the second light emitting cell, and the substrate; and an interconnection layer formed on the passivation layer to electrically connect the first light emitting cell to the second light emitting cell. The interconnection layer includes an edge lump portion formed around a first edge where the upper surface and the one facet of the first light emitting cell meet each other or a second edge where the upper surface and the other facet of the second light emitting cell meet each other.

10 Claims, 8 Drawing Sheets

(51) Int. Cl.
    *H01L 27/15*     (2006.01)
    *H01L 33/20*     (2010.01)
    *H01L 33/32*     (2010.01)
    *H01L 33/44*     (2010.01)

(52) U.S. Cl.
    CPC .............. *H01L 33/20* (2013.01); *H01L 33/32* (2013.01); *H01L 33/44* (2013.01); *H01L 2933/0066* (2013.01)

(56) References Cited

U.S. PATENT DOCUMENTS

| | | | |
|---|---|---|---|
| 9,673,254 B2 * | 6/2017 | Oh | ........................ H01L 27/156 |
| 2001/0017378 A1 | 8/2001 | Lell | |
| 2015/0021638 A1 * | 1/2015 | Oh | ........................ H01L 27/156 |
| | | | 257/91 |
| 2015/0333241 A1 * | 11/2015 | Chen | ........................ H01L 33/62 |
| | | | 257/93 |
| 2017/0069682 A1 * | 3/2017 | Chen | ........................ H01L 33/62 |

FOREIGN PATENT DOCUMENTS

| | | | |
|---|---|---|---|
| JP | 2014529195 | A | 10/2014 |
| JP | 2016-027672 | A | 2/2016 |
| KR | 20090049055 | A | 5/2009 |

OTHER PUBLICATIONS

Notice of Rejection dated Jan. 10, 2017 in Japanese Application No. 2016-150025, 7 pg(s).
Notice of Allowance dated May 2, 2017 in Japanese Application No. 2016-150025, 5 pg(s).

* cited by examiner

US 10,074,787 B2

LIGHT EMITTING DIODE

CROSS-REFERENCE TO RELATED APPLICATION(S)

This application relates to and claims priority to Korean Patent Application Nos. 10-2016-0058562, filed on May 13, 2016, the entire content of which is incorporated herein by reference in its entirety.

TECHNICAL FIELD

The present invention is related to a light emitting diode, and specifically to a light emitting diode including a plurality of light emitting cells on a single substrate that does not suffer from the problem of short lifetime caused by poor electrical connection or low luminous efficiency encountered when edge portions of interconnection layers electrically connecting the light emitting cells are defective in thickness.

BACKGROUND ART

Light emitting diodes (LEDs) are applied to backlight units of a variety of display devices as well as lighting systems and their applications are extended to more fields. Particularly, LEDs can be driven at relatively low voltage and have high energy efficiency, ensuring their low heat emission, long lifetime, and environmental friendliness. Thus, LEDs are expected to replace most of the current light source devices.

Many methods for fabricating light emitting diodes are known. As an example, a light emitting diode is fabricated by sequentially forming epilayers on a single substrate and forming a plurality of light emitting cells through a series of processes, such as etching and deposition. Light emitting diodes having a multi-cell structure including a plurality of light emitting cells formed on a single substrate are fabricated in various designs, whose examples are illustrated in FIGS. 1 and 2. FIG. 1 is a partial view of a light emitting diode having a multi-cell structure and FIG. 2 is a cross-sectional view of two light emitting cells 10 and 20 of the light emitting diode having a multi-cell structure, taken along line I-I of FIG. 1. As illustrated in FIGS. 1 and 2, a passivation layer 33 is formed to insulate the adjacent light emitting cells 10 and 20 and an interconnection layer 32 is formed on the passivation layer 33 to electrically connect the light emitting cells 10 and 20. The interconnection layer 32 is formed, for example, by a deposition process, such as sputtering or e-beam evaporation, and an etching process. In FIG. 2, reference numerals 1, 16/26, 11/21, 12/22, 13/23, 14/24, and 15/25 denote a substrate, electrodes, buffer layers, N-type semiconductor layers, active layers, P-type semiconductor layers, and transparent electrode layers, respectively. The electrode patterns and the connected state between the electrodes and the interconnection layer may vary, and their examples are illustrated in FIGS. 1 and 2.

As illustrated, when the interconnection layer 32 is formed on the passivation layer 33, many defects are formed in an edge portion of the interconnection layer 32, i.e. around an edge where one facet and the upper surface of each of the light emitting cells meet each other. That is, as illustrated in (a), (b), and (c) of FIG. 3, the edge portion where one facet and the upper surface of each of the light emitting cells meet each other is insufficiently deposited or is exposed during subsequent processing, such as etching, and as a result, a portion 32a, 32b or 32c of the interconnection layer around the edge portion is locally reduced in thickness. When power is supplied to each of the light emitting cells, a relatively large resistance is generated in the portion 32a, 32b or 32c. The large resistance increases the amount of heat generated in the interconnection layer, and as a result, the interconnection layer is electrically disconnected in the portion 32a, 32b or 32c. Thus, there is a need in the art to provide a solution to this problem.

PRIOR ART DOCUMENTS

Patent Documents

U.S. Pat. No. 6,472,718 (issued on Oct. 29, 2002)
Korean Patent No. 10-1239853 (issued on Feb. 27, 2013)

DISCLOSURE OF THE INVENTION

Problems to be Solved by the Invention

An object of the present invention is to provide an improved light emitting diode including a plurality of light emitting cells on a single substrate that does not suffer from the problem of defective interconnections, causing low luminous efficiency and short lifetime of the light emitting diode, in edge portions of the light emitting cells when interconnection layers are formed to electrically connect the light emitting cells.

Means for Solving the Problems

A light emitting diode according to an aspect of the present invention includes: a plurality of light emitting cells including a first light emitting cell and a second light emitting cell spaced apart from each other on a single substrate; a continuous passivation layer formed over the upper surface and one facet of the first light emitting cell, the upper surface and the other facet of the second light emitting cell, and the substrate; and an interconnection layer formed on the passivation layer to electrically connect the first light emitting cell to the second light emitting cell, wherein the interconnection layer includes an edge lump portion formed around a first edge where the upper surface and the one facet of the first light emitting cell meet each other or a second edge where the upper surface and the other facet of the second light emitting cell meet each other and protruding in a direction away from the edge.

According to one embodiment, the normal thickness of the edge lump portion of the interconnection layer is larger than that of the interconnection layer formed on the passivation layer in the normal direction.

According to one embodiment, the edge lump portion is divided into an upper portion, a lateral portion, and an intermediate portion disposed between the upper portion and the lateral portion, and at least one of the normal thickness of the upper portion, the normal thickness of the lateral portion, and the normal thickness of the intermediate portion is larger than the normal thickness of the interconnection layer.

According to one embodiment, the edge lump portion is elongated along the edge.

According to one embodiment, the plurality of light emitting cells are formed at intervals of 3 μm to 8 μm.

According to one embodiment, the interconnection layer includes a first portion and a second portion spaced apart from each other between the first emitting cell and the second light emitting cell and the shortest distance between the first portion and the second portion is from 1 to 6 μm.

According to one embodiment, one or more substrate patterns are formed between the first light emitting cell and the second light emitting cell.

According to one embodiment, the substrate patterns have the same shape.

According to one embodiment, the distance between the adjacent substrate patterns is not greater than 0.5 μm.

According to one embodiment, the substrate patterns have the same shape selected from domed, trapezoidal, inverted trapezoidal, and hemispherical shapes.

According to one embodiment, the upper surface and the one facet of the first light emitting cell meet each other at a right or obtuse angle and the upper surface and the other facet of the second light emitting cell meet each other at a right or obtuse angle.

According to one embodiment, the interconnection layer includes a first interconnection layer formed on the passivation layer and a second interconnection layer formed on the first interconnection layer.

According to one embodiment, the second interconnection layer is formed on the first interconnection layer that is hardened.

Effects of the Invention

The light emitting diode of the present invention is constructed such that the thickness of the interconnection layer around an edge portion of each of the light emitting cells is larger than that of any other portion of the interconnection layer. Due to this construction, the light emitting diode of the present invention does not suffer from poor electrical connection. Therefore, the light emitting diode of the present invention is prevented from malfunction caused by a defective interconnection and has high luminous efficiency.

Furthermore, the formation of two interconnection layers on each of the light emitting cells of the light emitting diode according to the present invention can help solve the problem of low luminous efficiency or short lifetime caused by an interconnection failure.

DETAILED DESCRIPTION FOR CARRYING OUT THE INVENTION

Preferred embodiments of the present invention will now be described with reference to the accompanying drawings. It should be noted that the drawings and embodiments described with reference to the drawings are simplified and illustrated such that those skilled in the art can readily understand the present invention. It should also be noted that the relative dimensions and scales of elements in the figures do not entirely reflect their actual dimensions and scales and are exaggerated for convenience in description.

The phrases "in edge portions of interconnection layers", "in edge portions of light emitting cells", and "around edge portions of light emitting cells" used in the description regarding the locations of edge lump portions in the interconnection layers have substantially the same meaning.

Figure 4:
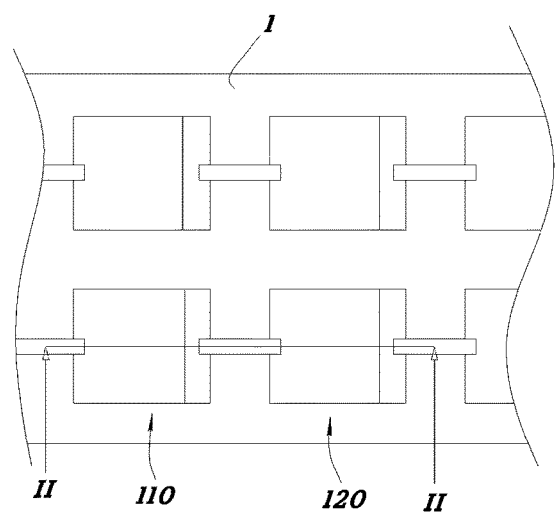
FIG. 4 is a partial view of a light emitting diode having a multi-cell structure according to one embodiment of the present invention.
Figure 5:
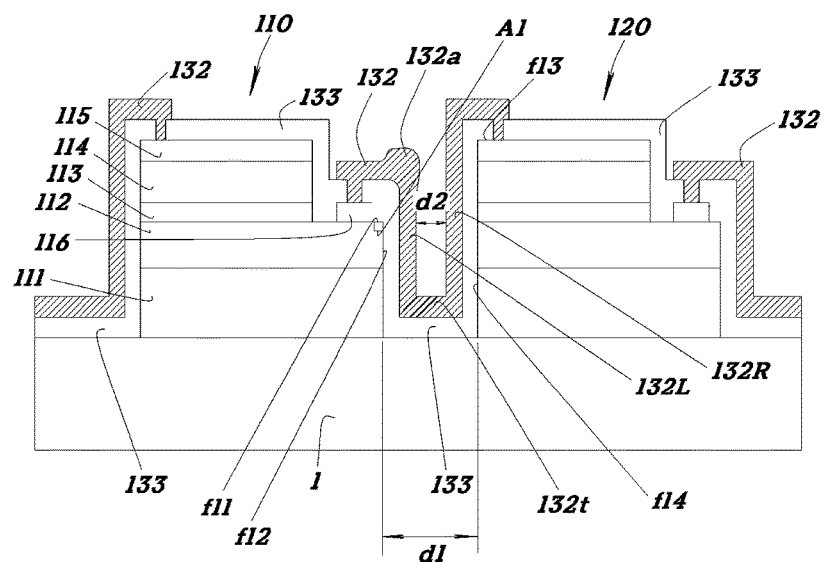
FIG. 5 is a cross-sectional view of two adjacent light emitting cells 110 and 120 and an edge lump portion 132a, taken along line II-II of FIG. 4.
Figure 6:
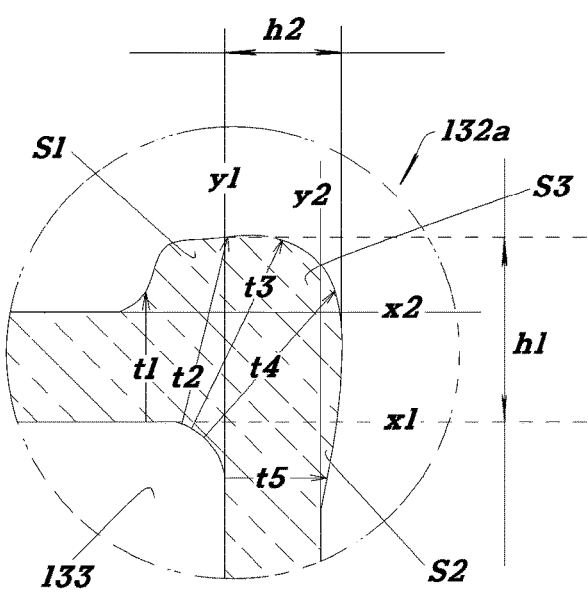
FIG. 6 is an enlarged view of the edge lump portion 132a illustrated in FIG. 5.
Figure 7:
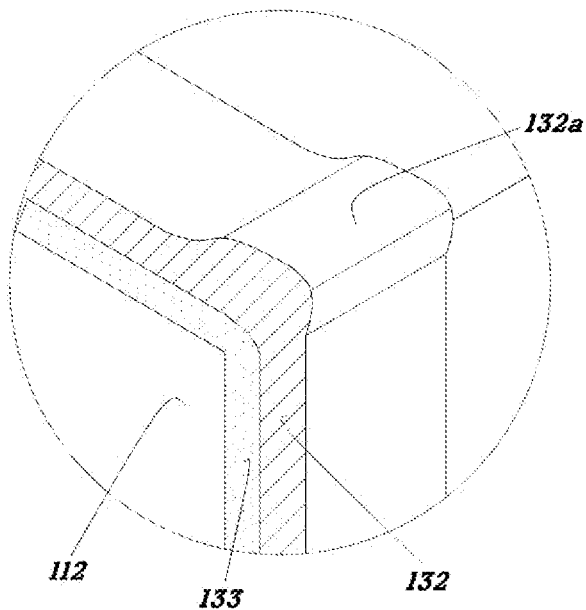
FIG. 7 is a perspective view showing the overall dimensions of the edge lump portion 132a illustrated in FIG. 5.
Figure 8:
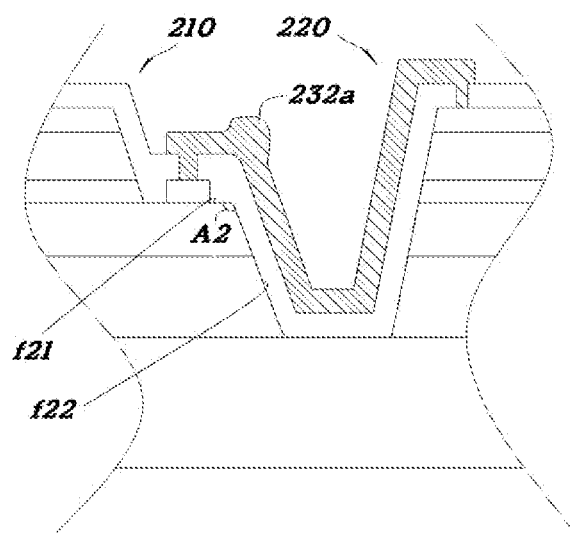
FIG. 8 is a cross-sectional view illustrating two light emitting cells 210 and 220 and an edge lump portion 232a in a light emitting diode according to a further embodiment of the present invention.
Figure 9:
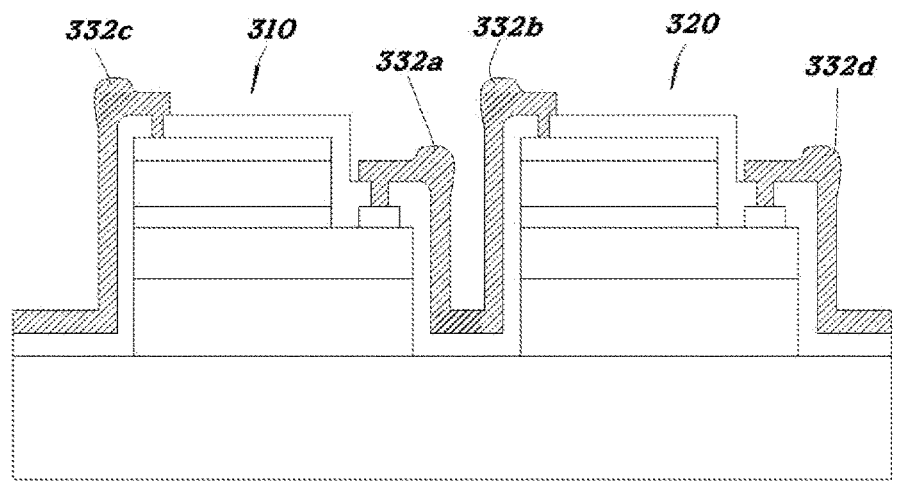
FIG. 9 is a cross-sectional view illustrating two light emitting cells 310 and 320 and edge lump portions 332a and 332b in a light emitting diode according to another embodiment of the present invention.
Figure 10:
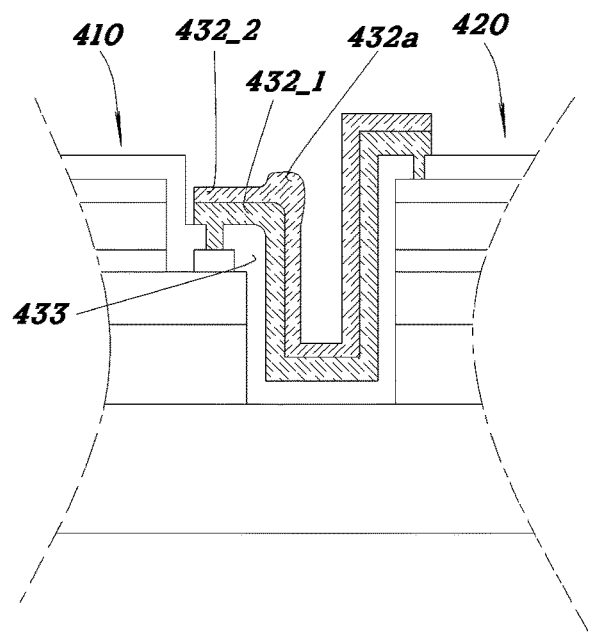
FIG. 10 is a cross-sectional view illustrating two light emitting cells 410 and 420, interconnection layers 432_1 and 432_2, and an edge lump portion 432a in a light emitting diode according to another embodiment of the present invention.
Figure 11:
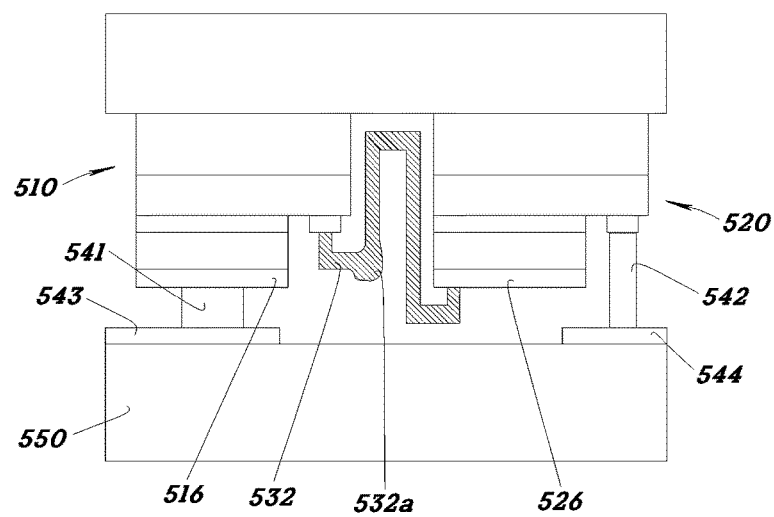
FIG. 11 illustrates a structure of a light emitting diode according to another embodiment of the present invention in which bumps 541 and 542 are electrically connected to bonding patterns 543 and 544 formed on sub-mount substrate 550 to supply power to flip-type light emitting cells 510 and 520, respectively.
Figure 12:
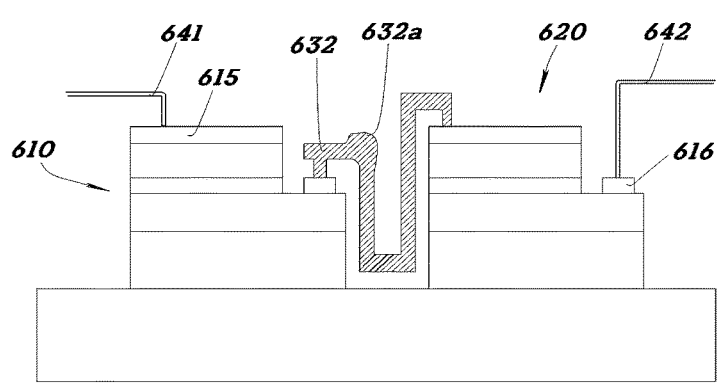
FIG. 12 illustrates a structure of a light emitting diode according to another embodiment of the present invention in which power is supplied to light emitting cells 610 and 620 through bonding wires 641 and 642, respectively.
Figure 13:
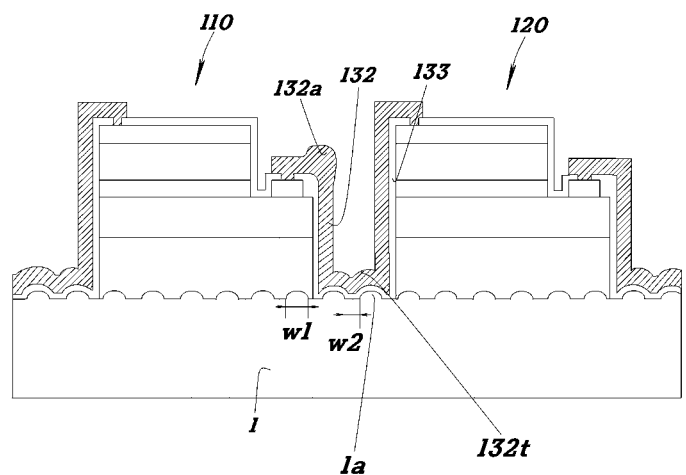
FIGS. 13, 14, and 15 illustrate structures of light emitting diodes according to other embodiments of the present invention in which one or more substrate patterns are formed between two light emitting cells 110 and 120 to achieve high light extraction efficiency; the substrate patterns are domed (FIG. 13), hemispherical (FIG. 14), and trapezoidal (FIG. 15) in shape.
Figure 14:
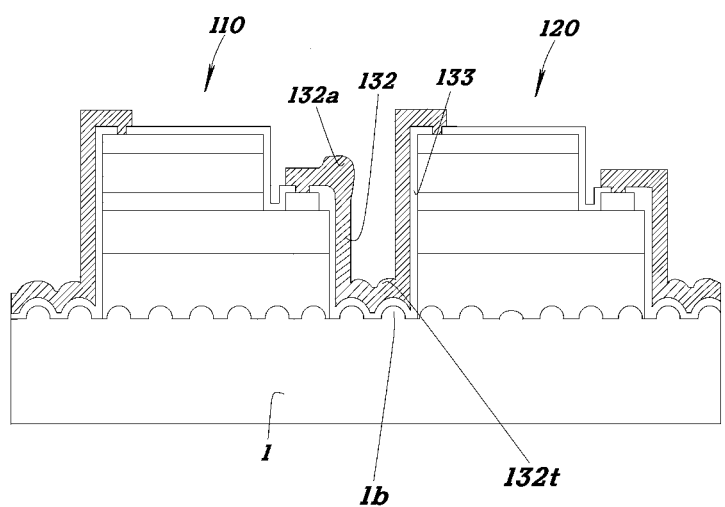
Figure 15:
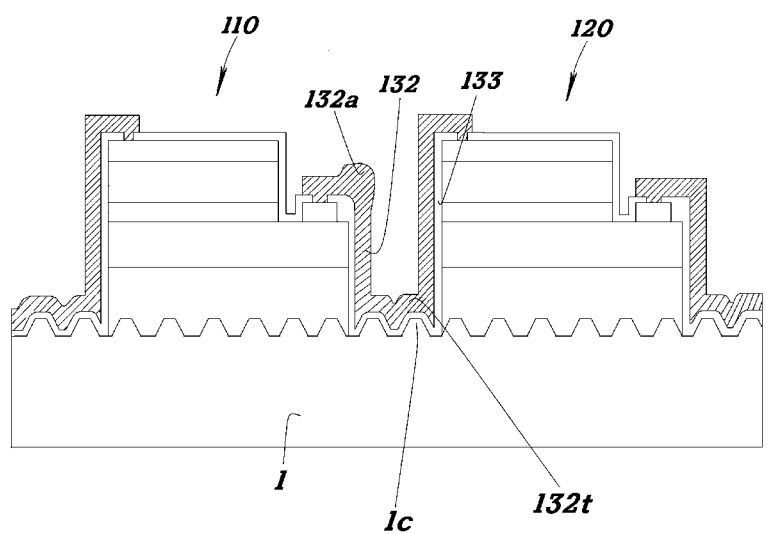

FIG. 4 is a partial view of a light emitting diode having a multi-cell structure according to one embodiment of the present invention, FIG. 5 is a cross-sectional view of two adjacent light emitting cells 110 and 120 and an edge lump portion 132a, taken along line II-II of FIG. 4, FIG. 6 is an enlarged view of the edge lump portion 132a illustrated in FIG. 5, FIG. 7 is a perspective view showing the overall dimensions of the edge lump portion 132a illustrated in FIG. 5, FIG. 8 is a cross-sectional view illustrating two light emitting cells 210 and 220 and an edge lump portion 232a in a light emitting diode according to a further embodiment of the present invention, FIG. 9 is a cross-sectional view illustrating two light emitting cells 310 and 320 and edge lump portions 332a and 332b in a light emitting diode according to another embodiment of the present invention, FIG. 10 is a cross-sectional view illustrating two light emitting cells 410 and 420, interconnection layers 432_1 and 432_2, and an edge lump portion 432a in a light emitting diode according to another embodiment of the present invention, FIG. 11 illustrates a structure of a light emitting diode according to another embodiment of the present invention in which bumps 541 and 542 are electrically connected to bonding patterns 543 and 544 formed on sub-mount substrate 550 to supply power to flip-type light emitting cells 510 and 520, respectively, FIG. 12 illustrates a structure of a light emitting diode according to another embodiment of the present invention in which power is supplied to light emitting cells 610 and 620 through bonding wires 641 and 642, respectively, and FIGS. 13, 14, and 15 illustrate structures of light emitting diodes according to other embodiments of the present invention in which one or more substrate patterns are formed between two light emitting cells 110 and 120 to achieve high light extraction efficiency; the substrate patterns are domed (FIG. 13), hemispherical (FIG. 14), and trapezoidal (FIG. 15) in shape.

Referring first to FIGS. 4 and 5, a light emitting diode according to one embodiment of the present invention includes: a plurality of light emitting cells 110 and 120 spaced apart from each other on a single substrate 1; a continuous passivation layer 133 formed over the upper surface and one facet of the first light emitting cell 110, the upper surface and the other facet of the second light emitting cell 120, and the substrate 1; and an interconnection layer 132 formed on the passivation layer 133 to electrically connect the first light emitting cell 110 to the second light emitting cell 120.

Power may be applied to the first 110 light emitting cell or the second light emitting cell 120 through bonding wires. Alternatively, bumps may be formed for power supply. In this case, the first and second light emitting cells are of flip types. The power supply through bumps and bonding wires will be described below with reference to FIGS. 11 and 12, respectively.

Figure 1:
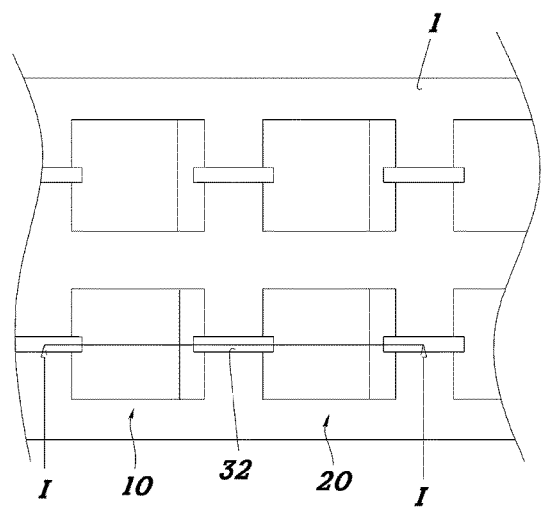
FIG. 1 is a partial view of a light emitting diode having a multi-cell structure.
Figure 2:
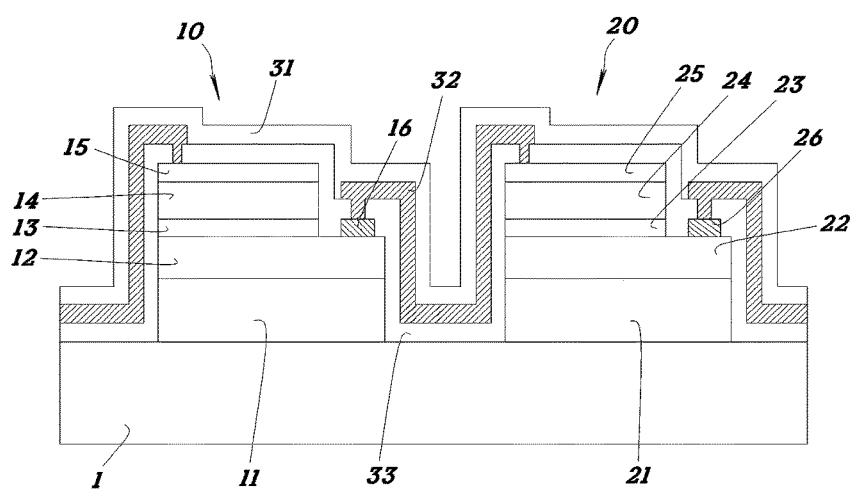
FIG. 2 is a cross-sectional view of two adjacent light emitting cells 10 and 20, taken along line I-I of FIG. 1.
Figure 3:
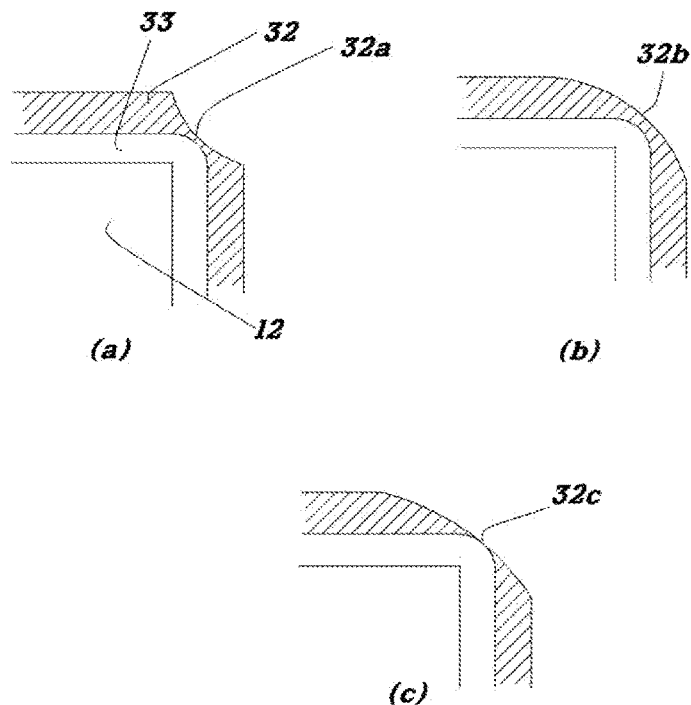
FIG. 3 explains the problems of conventional light emitting diodes.

The interconnection layer 132 includes an edge lump portion 132a formed around an edge where the upper surface f11 and one facet f12 of the light emitting cell 110 meet each other and protruding in a direction away from the edge. The edge lump portion 132a is an element that solves the structural problems of conventional light emitting diodes, particularly, the problem of poor electrical connection between light emitting cells caused by incomplete deposition of edge portions of interconnection layers for electrical connection between the light emitting cells, as described earlier. When it is intended to make the thickness of an interconnection layer in a conventional structure illustrated in FIG. 2 as small as possible taking into consideration the distance between light emitting cells, the interconnection layer tends to sag before complete formation of the interconnection layer by deposition around an edge portion where the upper surface and one facet of the light emitting cell meet each other. As a result, the upper end portion of the interconnection layer is made thin and the lower end portion of the interconnection layer is made thick, resulting in a substantial reduction in the distance between the light emitting cells and a reduction in the thickness of the interconnection layer in the edge portion where the upper surface and one facet of the interconnection layer meet each other (see (a), (b), and (c) of FIG. 3). Thus, the resistance of the interconnection layer is locally increased in the edge portion, leading to an increase in the amount of heat generated in the interconnection layer. The present invention has been made in view of the problems of conventional light emitting diodes and is characterized by the formation of an edge lump portion in the interconnection layer to prevent the interconnection layer from sagging from the upper end portion to the lower end portion, which will be explained below in more detail.

Each of the light emitting cells (for example, the light emitting cell 110) illustrated in FIG. 5 includes a buffer layer 111, an N-type semiconductor layer 112, an active layer 113, a P-type semiconductor layer 114, and a transparent electrode 115 formed in this order on a substrate 1. The light emitting cell further includes an N-type electrode 116 formed on the N-type semiconductor layer 112. In FIG. 5, the transparent electrode 115 formed on the P-type semiconductor layer 114 is directly connected to the interconnection layer. Alternatively, the transparent electrode 115 may be electrically connected to the interconnection layer 132 through an optional P-type electrode (not illustrated) formed on the interconnection layer 132. In the case where the plurality of light emitting cells are of flip types, the transparent electrode 115 may be omitted, and instead, a metal reflective layer or a distributed Bragg reflector (DBR) may be formed on the P-type semiconductor layer 114 to reflect downwardly directed light in the opposite direction. This will be explained below with reference to FIG. 11. The adjacent second light emitting cell 120 has the same structure as the light emitting cell 110. The following description is given mainly regarding the light emitting cell 110 but the same applies to the second light emitting cell 120.

The substrate 1 is typically selected from $Al_2O_3$, SiC, ZnO, Si, GaAs, GaP, $LiAl_2O_3$, BN, AlN, and GaN wafers. The substrate 1 may have a pattern shape consisting of a plurality of patterns (hereinafter referred to as the "substrate patterns"). The patterned substrate may be a patterned sapphire ($Al_2O_3$) substrate (PSS). The patterned sapphire substrate is mainly used to improve the external quantum efficiency (EUE) of light emitting diodes. The substrate patterns are typically domed, hemispherical, or trapezoidal (or inverted trapezoidal) in shape. Such PSSs are similarly applicable to the formation of a plurality of light emitting cells thereon and examples thereof are illustrated in FIGS. 13 to 15. Specifically, FIGS. 13 to 15 illustrate different shapes of substrate patterns 1a (domed), 1b (hemispherical), and 1c (trapezoidal), respectively. Shapes other than those of the substrate patterns 1a, 1b, and 1c can also be considered.

When the light emitting cell 110 and the second light emitting cell 120 are formed on the single substrate, the distance d1 between the light emitting cell 110 and the second light emitting cell 120 should be taken into consideration. This consideration may affect the shape of the substrate patterns and the distance between the substrate patterns to some extent. That is, the distance d1 between the light emitting cell 110 and the second light emitting cell 120 is associated with the extraction effect of light emitted from the light emitting cells and is closely related to the interconnection layer 132, which will be explained with reference to FIGS. 13 to 15 together with FIG. 5.

In view of the relation of the distance d1 to the interconnection layer 132, it is preferred that the distance d1 is not greater than 10 µm. If the distance d1 between the first light emitting cell 110 and the second light emitting cell 120 is less than 3 µm, portions of the interconnection layer may overlap on the substrate between the light emitting cell 110 and the second light emitting cell 120 because the thickness of the interconnection layer 132 electrically connecting the light emitting cell 110 to the second light emitting cell 120 should be in the range of about 0.2 to about 2 µm (including the thickness of the passivation layer formed under the interconnection layer). Thus, it is preferred to adjust the distance between the light emitting cell 110 and the second light emitting cell 120 to at least 3 µm, as mentioned above. The distance d1 between the light emitting cell 110 and the second light emitting cell 120 is preferably in the range of 3 µm to 10 µm. Generally, each of the substrate patterns 1a, 1b or 1c has a width (w1; FIG. 13) of 3 µm or less based on light extraction efficiency. As a result, the portion of the interconnection layer 132 on the substrate between the light emitting cell 110 and the second light emitting cell 120 is incompletely formed in a curved shape corresponding to the substrate patterns 1a, 1b or 1c. However, since the interconnection layer 132 is not formed over the entire area of the substrate patterns 1a, 1b or 1c of the substrate 1, it will not interfere with the light extraction effect of the substrate patterns 1a, 1b or 1c. Given that the width (w2; FIG. 13) between the substrate patterns 1a, 1b or 1c is 0.5 µm or less, it is most preferred that the distance between the light emitting cell 110 and the second light emitting cell 120 is from 3 µm to 8 µm. Here, the shortest distance d2 between a first portion 132L of the interconnection layer formed above the light emitting cell 110 and a second portion 132R of the interconnection layer formed over the second light emitting cell 120 is preferably from 1 to 6 µm. That is, the first portion 132L and the second portion 132R of the interconnection layer 132 electrically connecting the light emitting cell 110 to the second light emitting cell 120 are spaced apart from each other at the shortest distance d2. A reduction in the width w2 between the substrate patterns 1a (FIG. 13), 1b (FIG. 14) or 1c (FIG. 15) formed between the first light emitting cell 110 and the second light emitting cell 120 can lead to the formation of a larger number of the substrate patterns.

The buffer layer 111 serves to reduce lattice mismatch between the substrate 1 and the N-type semiconductor layer 112 during crystal growth of the N-type semiconductor layer 112. The buffer layer 111 is typically formed using GaN or AlN. However, the buffer layer 111 is optional and does not need to be used. The N-type semiconductor layer 112 serves to provide electrons to the active layer 113. Examples of materials for the N-type semiconductor layer 112 include nitrides of Groups III-V elements, such as GaN, InN, and AlN. These nitrides may be used alone or as a mixture of two or more thereof in a predetermined ratio. The active layer 113 is a region with a predetermined bandgap in which a quantum well is created so that electrons and holes can recombine. The kind of the material for the active layer may vary depending on the wavelength of light emitted from the active layer 113. InGaN, a nitrogenous compound, is used to produce blue light at 420 to 470 nm, InAlGaP is used to produce red light, and InAlGaN is used to produce light at a wavelength shorter than that of blue light. The P-type semiconductor layer 114 serves to provide holes to the active layer 113. The P-type semiconductor layer 114 may be a GaN layer doped with a P-type dopant. The transparent electrode 115 serves to present a larger area through which an electric current flows into the P-type semiconductor layer 114. The transparent electrode 115 may be made of a transparent conductive material, for example, ITO, IZO, ZnO or MgO.

The layers formed on the substrate 1 are formed by various deposition or growth processes, including metal organic chemical vapor deposition (MOCVD), chemical vapor deposition (CVD), plasma-enhanced chemical vapor deposition (PECVD), molecular beam epitaxy (MBE), and hydride vapor phase epitaxy (HVPE).

In the case where the plurality of light emitting cells formed on the single substrate are of flip types, as illustrated in FIG. 11, reflective layers 516 and 526 may be formed on the P-type semiconductor layers 114. The reflective layers may be formed using a suitable metal material, such as silver (Ag), aluminum (Al) or gold (Au). The reflectance of silver (Ag) reflective layers is high in the blue wavelength band but is not high in the UVA wavelength band (typically 315 nm to 420 nm). Aluminum (Al) reflective layers are highly reflective in the UVA wavelength band but have poor ohmic contact with the P-type semiconductor layers 114. The ohmic contact with the P-type semiconductor layers 114 is improved by interposing P-type intermediate layers (not illustrated) between the reflective layers and the P-type semiconductor layers. Distributed Bragg reflectors (DBR) may be further formed to increase the reflectance of the reflective layers and control the reflection wavelength range of the reflective layers.

The passivation layer 133 is interposed between the interconnection layer 132 and the light emitting cell 110 to prevent short-circuiting between the N-type semiconductor layer 112 and the P-type semiconductor layer 114 in the light emitting cell 110. The interconnection layer 132 deposited on the passivation layer 133 is connected to the adjacent light emitting cells or a power source.

As mentioned earlier, incomplete deposition tends to occur frequently around the edge where the upper surface f11 and the one facet f12 of the light emitting cell 110 meet each other. This problem is avoided by the formation of the edge lump portion 132a in the edge portion.

The thickness of the edge lump portion 132a is larger than that of any other portion of the interconnection layer 132. As illustrated in FIGS. 5 and 6, the edge lump portion 132a has a first thickness h1, which is measured from the passivation layer 133 formed on the upper surface f11 of the light emitting cell 110 and a second thickness h2, which is measured from the passivation layer 133 formed on the one facet f12 of the light emitting cell 110. Both the first thickness h1 and the second thickness h2 are larger than the thickness of any other portion of the interconnection layer 132, as illustrated in FIG. 6. However, either of the first thickness h1 and the second thickness h2 may be larger than the thickness of any other portion of the interconnection layer 132.

The thickness used herein refers to the thickness measured in the direction perpendicular to a base plane or the thickness in the direction perpendicular to the tangent of a base portion, which is separately defined as the normal thickness. For example, t1, t2, t3, t4, and t5 in FIG. 6 are the normal thicknesses. A silicon nitride film or silicon oxide film as a protective layer may be formed on the exposed upper portion of the interconnection layer including the edge lump portion.

The edge lump portion 132a will be described in more detail with reference to FIG. 6. The edge lump portion 132a is divided into an upper portion S1, a lateral portion S2, and an intermediate portion S3. The upper portion S1 is the left portion relative to a line y1 extending perpendicularly to the passivation layer 133, the lateral portion S2 is the lower portion relative to a line x1 extending horizontally from the passivation layer 133, and the intermediate portion S3 is the portion defined between the right portion relative to the line y1 and the upper portion relative to the line x1. The described problems of the prior art are solved by designing the interconnection layer 132 such that at least one of the normal thicknesses t1 and t2 of the upper portion S1, the normal thicknesses t3 and t4 of the intermediate portion S3, and the normal thickness t5 of the lateral portion S2 is larger than the thickness of any other portion of the interconnection layer 132. The thicknesses of the other portions of the interconnection layer 132 refer to the normal thicknesses of the interconnection layer 132. The normal thicknesses of the interconnection layer 132 can be defined as the distance between x1 and x2 and the distance between y1 and y2.

Referring next to FIG. 7, the edge lump portion 132a of the interconnection layer 132 may be elongated on the passivation layer along the edge where the upper surface f11 and the one facet f12 of the light emitting cell 110 meet each other (see FIG. 5).

The edge lump portion 132a is formed at the edge where the upper surface f11 and the one facet f12 of the light emitting cell 110 form a right angle A1 to each other, as illustrated in FIG. 5, but an edge lump portion 232a may be applied to a structure having a trapezoidal cross section, i.e. a structure in which the upper surface f21 and one facet f22 of a light emitting cell 210 form an obtuse angle A2 to each other, as illustrated in FIG. 8.

As illustrated in FIG. 9, edge lump portions 332a, 332b, 332c, and 332d may be applied to edge portions of all interconnection layers of light emitting cells 310 and 320. That is, the edge lump portions 332a and 332b may be formed around a first edge where the upper surface and one facet of a first light emitting cell 310 meet each other and around a second edge where the upper surface and the other facet of a second light emitting cell 320 meet each other, respectively. The formation of edge lump portions around edges of all light emitting cells, including a light emitting cell adjacent to the left side of the first light emitting cell 310 or a light emitting cell adjacent to the right side of the second light emitting cell 320, can reduce the generation of heat caused by defective interconnection.

As illustrated in FIG. 10, two interconnection layers 432_1 and 432_2 may be formed on a passivation layer 433. The first interconnection layer 432_1 is formed on the passivation layer 433 and the second interconnection layer 432_2 is then formed on the first interconnection layer 432_1 that is hardened to some extent. Although FIG. 10 illustrates the formation of an edge lump portion 432a only in the second interconnection layer 432_2, another edge lump portion (not illustrated) may be formed in the first interconnection layer 432_1 to realize a double interconnection structure. The first interconnection layer 432_1 and the second interconnection layer 432_2 may be formed using the same or different metal materials. FIG. 10 illustrates the formation of the edge lump portion 432a only above one light emitting cell 410, whereas an additional edge lump portion may be formed around the edge portion of the adjacent light emitting cell 420, as illustrated in FIG. 9. Furthermore, the basic structure in which the edge lump portion is formed in the interconnection layer may be also modified by appropriate combination with the structures of FIGS. 8 to 10.

FIG. 11 illustrates a structure in which a plurality of flip-type light emitting cells 510 and 520 are formed on a single substrate. In FIG. 11, bumps 541 and 542 are formed to electrically connect the light emitting cells to bonding patterns 543 and 544 on a sub-mount substrate 550. As illustrated, reflective layers 516 and 526 are formed to reflect light emitted from the flip-type light emitting cells toward the sub-mount substrate 550. As mentioned earlier, distributed Bragg reflectors (DBRs) as well as the reflective layers may be formed to increase the reflectance of the reflective layers or control the reflection wavelength range of the reflective layers. As illustrated in FIG. 11, an edge lump portion 532a is formed in an interconnection layer 532 to electrically connect the first light emitting cell 510 to the second light emitting cell 520. With this arrangement, the first light emitting cell 510 and the second light emitting cell 520 can be electrically connected to the bonding patterns 543 and 544 formed on the sub-mount substrate 550 through the bumps 541 and 542, respectively. Although only two light emitting cells are illustrated in FIG. 11, one or more light emitting cells may be further provided. In this case, the left-most light emitting cell and the right-most light emitting cell can be electrically connected to bonding patterns on the sub-mount substrate 550 through additional bumps.

FIG. 12 illustrates the use of bonding wires 641 and 642 through which power is supplied to a plurality of light emitting cells 610 and 620. The bonding wire 641 for power supply may be directly connected to a transparent electrode 615. Alternatively, the bonding wire 641 may be bonded to a P-type electrode (not illustrated). The right bonding wire 642 may electrically connect the second light emitting cell 420 to a third light emitting cell (not illustrated) adjacent to the right side of the second light emitting cell 420. In this case, an interconnection layer 632 formed with an edge lump portion 632a for electrical connection between the first light emitting cell 610 and the second light emitting cell 620 is also applicable for electrical connection between the second light emitting cell 620 and the third light emitting cell.

In conclusion, the formation of the edge lump portion in the edge portion of the interconnection layer for electrical connection between the adjacent light emitting cells can provide a solution to the problems of poor electrical connection, low luminous efficiency, and short lifetime, which are caused by incomplete deposition of the edge portion.

Although the light emitting diode of the present invention has been described herein with reference to the foregoing embodiments, those skilled in the art can conceive other modifications based on the disclosure set forth herein. However, it should be noted that such modifications are encompassed in the present invention without departing from the spirit and scope of the present invention.

EXPLANATION OF REFERENCE NUMERALS

1: Substrate
110, 120, 210, 220, 310, 320, 410, 420, 510, 520, 610, 620: Light emitting cells
132, 232, 332, 442, 532, 632: Interconnection layers
133: Passivation layer
132a, 232a, 332a, 332b, 432a, 532a, 632a: Edge lump portions

The invention claimed is:
1. A light emitting diode comprising:
a plurality of light emitting cells comprising a first light emitting cell and a second light emitting cell spaced apart from each other on a single substrate;
a continuous passivation layer formed over the upper surface and one facet of the first light emitting cell, the upper surface and the other facet of the second light emitting cell, and the substrate, wherein the other facet of the second light emitting cell corresponds to the one facet of the first light emitting cell; and
an interconnection layer formed on the passivation layer to directly and electrically connect the first light emitting cell to the second light emitting cell,
wherein the interconnection layer comprises an edge lump portion formed around a first edge where the upper surface and the one facet of the first light emitting cell meet each other or a second edge where the upper surface and the other facet of the second light emitting cell meet each other, and wherein the edge lump portion protrudes in a direction away from the edge;
wherein the edge lump portion comprises:
an upper portion extending in a vertical direction of the passivation layer,
a lateral portion extending in a lateral direction of the passivation layer, and an intermediate portion connecting the upper portion with the lateral portion, wherein at least one of the normal thickness of the upper portion of the edge lump portion, the normal thickness of the lateral portion of the edge lump portion, and the normal thickness of the intermediate portion of the edge lump portion are larger than a thickness of other portion other than the edge lump portion in the interconnection layer;

wherein the interconnection layer comprises a first interconnection layer formed on the passivation layer and a second interconnection layer formed on the first interconnection layer, and wherein the edge lump portion is formed in the second interconnection layer.

2. The light emitting diode according to claim 1, wherein the edge lump portion is elongated along the first and second edges.

3. The light emitting diode according to claim 1, wherein the plurality of light emitting cells are formed at intervals of 3 μm to 8 μm.

4. The light emitting diode according to claim 1, wherein the interconnection layer comprises a first portion and a second portion spaced apart from each other between the first emitting cell and the second light emitting cell and the shortest distance between the first portion and the second portion is from 1 to 6 μm.

5. The light emitting diode according to claim 1, wherein one or more substrate patterns are formed on the upper surface of the substrate between the first light emitting cell and the second light emitting cell.

6. The light emitting diode according to claim 5, wherein the substrate patterns have the same shape.

7. The light emitting diode according to claim 5, wherein the distance between the adjacent substrate patterns is not greater than 0.5 μm.

8. The light emitting diode according to claim 5, wherein the substrate patterns have the same shape selected from domed, trapezoidal, inverted trapezoidal, and hemispherical shapes.

9. The light emitting diode according to claim 1, wherein the upper surface and the one facet of the first light emitting cell meet each other at a right or obtuse angle and the upper surface and the other facet of the second light emitting cell meet each other at a right or obtuse angle.

10. The light emitting diode according to claim 1, wherein the second interconnection layer is formed on the first interconnection layer that is hardened.

* * * * *